(12) United States Patent
Seo

(10) Patent No.: US 8,427,893 B2
(45) Date of Patent: Apr. 23, 2013

(54) REDUNDANCY MEMORY CELL ACCESS CIRCUIT AND SEMICONDUCTOR MEMORY DEVICE INCLUDING THE SAME

(75) Inventor: Eunsung Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 769 days.

(21) Appl. No.: 12/214,727

(22) Filed: Jun. 20, 2008

(65) Prior Publication Data

US 2008/0316838 A1 Dec. 25, 2008

(30) Foreign Application Priority Data

Jun. 21, 2007 (KR) .................. 10-2007-0061219

(51) Int. Cl.
*G11C 29/00* (2006.01)
*G11C 29/04* (2006.01)
*G11C 29/18* (2006.01)
*G11C 29/24* (2006.01)

(52) U.S. Cl.
USPC ........ 365/200; 365/201; 365/225.7; 714/710; 714/711

(58) Field of Classification Search .................. 365/200, 365/201, 225.7; 714/710, 711
See application file for complete search history.

(56) References Cited

U.S. PATENT DOCUMENTS

| | | | | |
|---|---|---|---|---|
| 5,113,371 A | * | 5/1992 | Hamada | 365/200 |
| 5,404,331 A | * | 4/1995 | McClure | 365/200 |
| 5,530,674 A | * | 6/1996 | McClure et al. | 365/201 |
| 5,570,317 A | * | 10/1996 | Rosen et al. | 365/200 |
| 5,905,690 A | * | 5/1999 | Sakurai et al. | 365/233.1 |
| 2004/0221210 A1 | * | 11/2004 | Hoffmann et al. | 714/719 |

OTHER PUBLICATIONS

Korean Patent Application No. 1019990009867 having Publication date of Oct. 16, 2000 (w/ English Abstract page).
Korean Patent Application No. 1019990018504 having Publication date of Dec. 15, 2000 (w/ English Abstract page).
Korean Patent Application No. 1019990045630 having Publication date of May 15, 2001 (w/ English Abstract page).
Korean Patent Application No. 1020050057807 to Shin, having Publication date of Jan. 5, 2007 (w/ English Abstract page).
Japanese Patent Application No. 2002-066720 to Kiyohiro et al., having Publication date of Sep. 19, 2003 (w/ English Abstract page).
Japanese Patent Application No. 2003-078474 to Naokazu, having Publication date of Oct. 14, 2004 (w/ English Abstract page).

* cited by examiner

*Primary Examiner* — J. H. Hur
(74) *Attorney, Agent, or Firm* — Monica H. Choi

(57) ABSTRACT

A redundancy memory cell access circuit includes a first control unit, a second control unit, and an accessing unit. The first control unit compares an unprogrammed fuse signal with an address signal to generate a first redundancy enable signal from the comparison. The accessing unit allows access to a redundancy memory cell corresponding to the unprogrammed signal when the first redundancy enable signal from the first control unit or a second redundancy enable signal from the second control unit is activated. Thus, the redundancy memory cell access circuit is tested simultaneously with testing of the redundancy memory cell for minimized testing and programming times.

20 Claims, 9 Drawing Sheets

<NORMAL OPERATION MODE, FIRST PATH>

<TEST OPERATION MODE, SECOND PATH>

<TEST OPERATION MODE, THIRD PATH>

REDUNDANCY MEMORY CELL ACCESS CIRCUIT AND SEMICONDUCTOR MEMORY DEVICE INCLUDING THE SAME

BACKGROUND OF THE INVENTION

This application claims priority under 35 USC §119 to Korean Patent Application No. 10-2007-0061219, filed on Jun. 21, 2007 in the Korean Intellectual Property Office, the disclosure of which is incorporated herein in its entirety by reference.

FIELD OF THE INVENTION

The present invention relates generally to semiconductor memory devices, and more particularly, to testing of at least one fuse unit in a redundancy memory cell access circuit during testing of a redundancy memory cell.

BACKGROUND OF THE INVENTION

When a memory cell in a semiconductor memory device is defective, the defective memory cell is replaced with a redundancy memory cell for increasing the manufacturing yield of the semiconductor memory device. Thus, the semiconductor memory device is fabricated with redundancy memory cells.

Such redundancy memory cells are desired to be tested for proper operation before replacing defective memory cells. In particular, at least one fuse unit in a redundancy memory cell access circuit used to replace a defective memory cell with a redundancy memory cell is desired to be tested for proper operation.

SUMMARY OF THE INVENTION

Accordingly, a redundancy memory cell access circuit of an aspect of the present invention includes components for testing the functionality of the memory cell access circuit including fuse units during testing of a corresponding redundancy memory cell.

A redundancy memory cell access circuit of an aspect of the present invention includes a first control unit and an accessing unit. The first control unit compares an unprogrammed fuse signal with an address signal to generate a first redundancy enable signal from the comparison. The accessing unit allows access to a redundancy memory cell corresponding to the address signal when the first redundancy enable signal is activated.

In an embodiment of the present invention, the first control unit activates the first redundancy enable signal if the unprogrammed fuse signal is substantially same as a desired address signal when a first test mode signal is activated during a test mode. In that case, the first control unit includes an address fuse unit and a comparison unit. The address fuse unit generates the unprogrammed fuse signal from a plurality of address fuses that are not programmed during the test mode. The comparison unit compares the unprogrammed fuse signal with the address signal to generate the first redundancy enable signal from the comparison.

In a further embodiment of the present invention, the redundancy memory cell access circuit includes a second control unit for activating a second redundancy enable signal when a second test mode signal is activated during a test mode. In that case, the accessing unit provides access to the redundancy memory cell when the second redundancy enable signal is activated for writing into the redundancy memory cell without regard to functionality of any fuse unit before the redundancy memory cell is accessed via the first control unit.

In an embodiment of the present invention, the first control unit is disabled to generate the first enable signal that is inactivated when the first test mode signal is inactivated. In addition, the second control unit is disabled to generate the second enable signal that is inactivated when the second test mode signal is inactivated. In that case, the second test mode signal is first activated while the first test mode signal is inactivated, and the first test mode signal is subsequently activated while the second test mode signal is inactivated, during the test mode.

In a further embodiment of the present invention, the redundancy memory cell access circuit includes a signal provision unit that generates a normal mode signal that is activated when a master fuse unit is inoperative during the test mode. In that case, the first control unit inactivates the first redundancy enable signal such that the accessing unit prevents access to the redundancy memory cell when the master fuse unit is inoperative.

In another embodiment of the present invention, a normal memory cell corresponding to the address signal is accessed for indicating that at least one of the address fuse unit and the master fuse unit is inoperative when the first redundancy enable signal is inactivated during the test mode.

In a further embodiment of the present invention, bit data is read from the redundancy memory cell when the first redundancy enable signal is activated. In that case, the read bit data is compared with a desired bit data to determine whether the redundancy memory cell is operative during the test mode.

In another embodiment of the present invention, the signal provision unit activates the normal mode signal transmitted to the first control unit that provides access to the redundancy memory cell when a programmed fuse signal is same as the address signal during a normal operating mode if the address fuse unit, the master fuse unit, and the redundancy memory cell have been determined to be operative as indicated by the master fuse unit that is programmed.

In an alternative embodiment of the present invention, the normal mode signal, the first test mode signal, and the second test mode signal are generated from a mode setting register when the redundancy memory cell access circuit does not have a master fuse unit.

The redundancy memory cell access circuit is included in a semiconductor memory device including a normal memory cell array and a redundancy memory cell array having the redundancy memory cell for replacing a defective memory cell in the normal memory cell array.

In this manner, the fuse units of the redundancy memory cell access circuit are tested as the corresponding redundancy memory cell is being tested. Thus, the redundancy memory cell access circuit is efficiently tested with minimized testing time. In addition, the redundancy memory cell is used to replace the defective memory cell if both the redundancy memory cell access circuit and the redundancy memory cell are operative.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 2C, 3, 4, 5, 6, 7, 8, 9, 10A, and 10B refer to elements having similar structure and/or function.

DETAILED DESCRIPTION OF THE INVENTION

The present invention is described more fully in the following with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
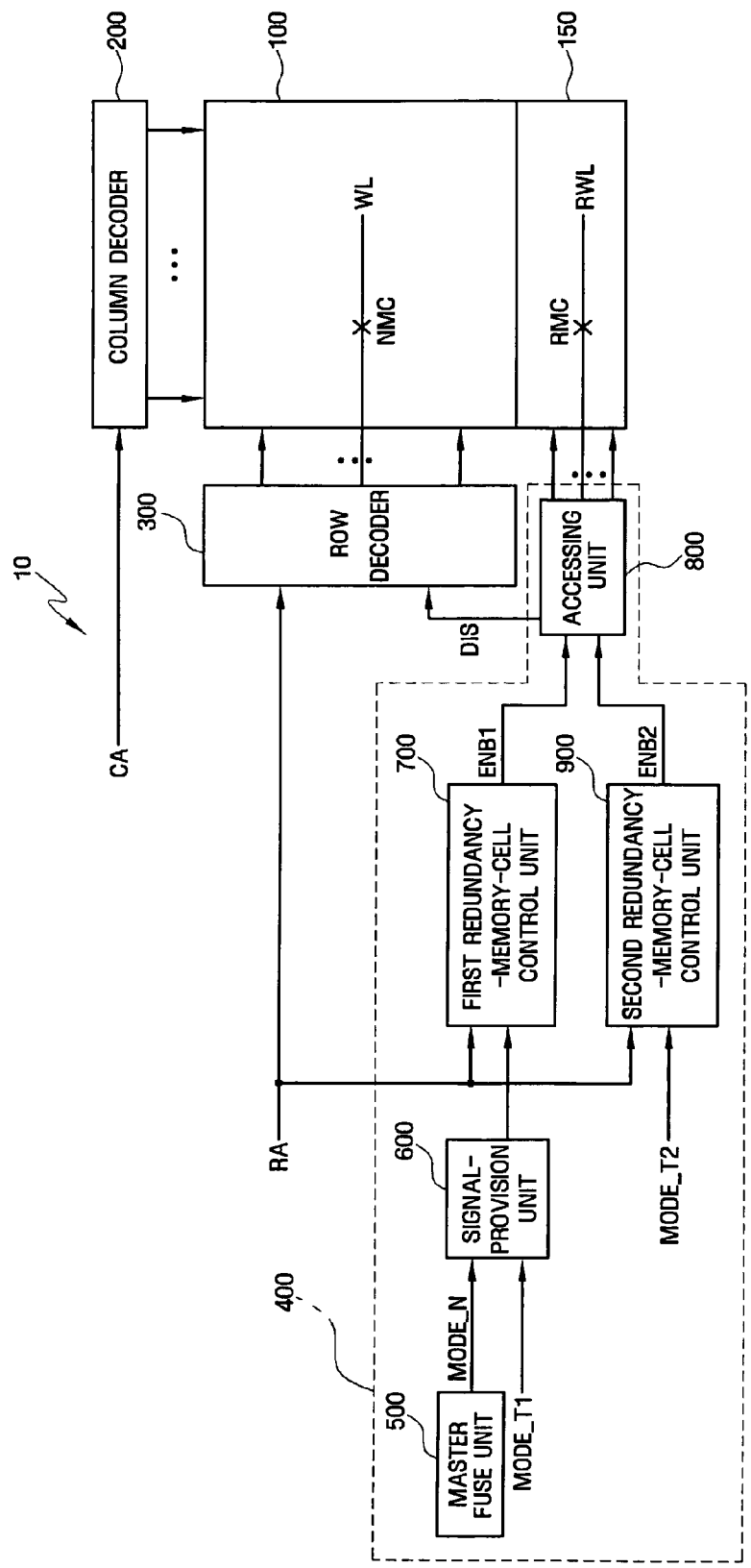
FIG. 1 is a block diagram of a semiconductor memory device with a redundancy memory cell access circuit that is tested during testing of a redundancy memory cell according to an embodiment of the present invention.

FIG. 1 is a block diagram of a semiconductor memory device 10 with a redundancy memory cell access circuit 400 that is tested during testing of a redundancy memory cell RMC according to an embodiment of the present invention. Referring to FIG. 1, the semiconductor memory device 10 includes a normal memory cell array 100 and a redundancy memory cell array 150.

The normal memory cell array 100 includes normal memory cells NMCs that are accessed via a column decoder 200 and a row decoder 300 for the usual memory functionality of the semiconductor memory device 10. The redundancy memory cell array 150 includes redundancy memory cells RMC accessed via the redundancy memory cell access circuit 400 for replacing a normal memory cell that is defective within the normal memory cell array 100.

The normal memory cell array 100 includes a plurality of normal wordlines WLs with each normal wordline WL connected to a respective row of normal memory cells NMCs. The row decoder 300 and the column decoder 200 decode a row address signal RA and a column address signal CA, respectively, to select a corresponding normal memory cell NMC to be accessed for a writing or reading of data.

In the semiconductor memory device 10 of FIG. 1, a normal wordline WL of a defective memory cell NMC in the normal memory cell array 100 is replaced with a corresponding redundancy wordline RWL of a redundancy memory cell RMC in the redundancy memory cell array 150 for replacing the defective memory cell NMC with the redundancy memory cell RMC. In that case, the redundancy memory cell access circuit 400 and the column decoder 200 select the redundancy memory cell RMC for access instead of the defective memory cell NMC. However, the present invention is not limited thereto such that the present invention may also be practiced with a normal column line (not shown) being replaced with a redundancy column line (not shown) for replacing the defective memory cell NMC.

Figure 2A:
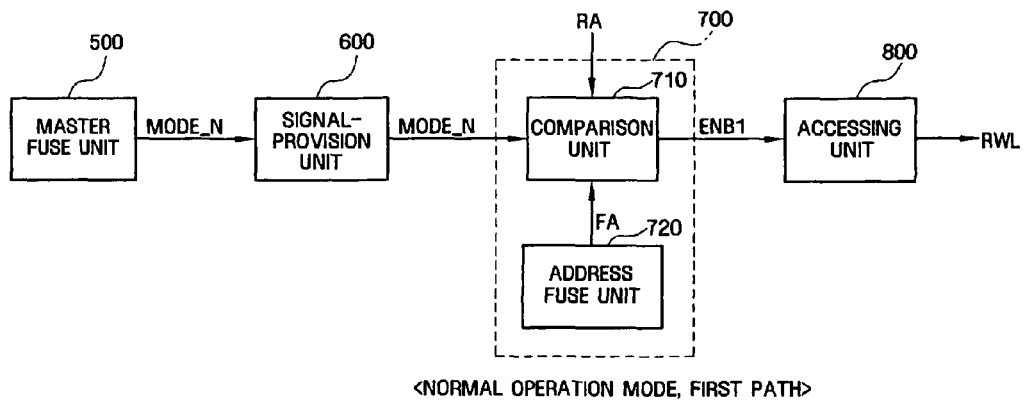
FIG. 2A is a block diagram with components of the redundancy memory cell access circuit of FIG. 1 forming a first path used during a normal operating mode according to an embodiment of the present invention.
Figure 2B:
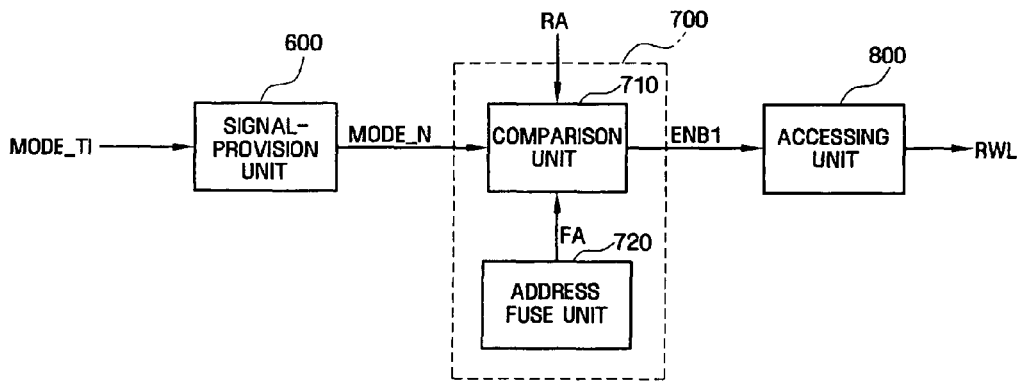
FIG. 2B is a block diagram with components of the redundancy memory cell access circuit of FIG. 1 forming a second path used during a test mode of operation according to an embodiment of the present invention.
Figure 2C:
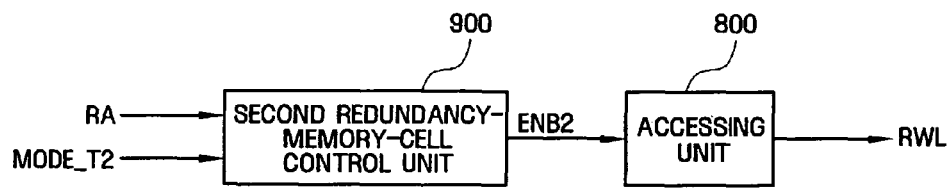
FIG. 2C is a block diagram with components of the redundancy memory cell access circuit of FIG. 1 forming a third path used during the test mode of operation according to an embodiment of the present invention.

The redundancy memory cell access circuit 400 includes a master fuse unit 500, a signal provision unit 600, a first redundancy memory cell control unit 700, a second redundancy memory cell control unit 900, and an accessing unit 800. FIG. 2A is a block diagram with components of the redundancy memory cell access circuit 400 forming a first path used during a normal operating mode. FIGS. 2B and 2C show block diagrams with components of the redundancy memory cell access circuit 400 forming second and third paths used during a test mode of operation.

The first path of FIG. 2A is formed by the master fuse unit 500, the signal provision unit 600, the first redundancy memory cell control unit 700, and the accessing unit 800. The second path of FIG. 2B is formed by the signal provision unit 600, the first redundancy memory cell control unit 700, and the accessing unit 800. The third path of FIG. 2C is formed by the second redundancy memory cell control unit 900 and the accessing unit 800. The first redundancy memory cell control unit 700 in FIGS. 2A and 2B includes a comparison unit 710 and an address fuse unit 720.

The second path of FIG. 2B is used to test whether the master fuse unit 500 and the address fuse unit 720 in the first redundancy memory cell control unit 700 are operative simultaneously with testing of the redundancy memory cell RMC during the test mode of operation. The second path of FIG. 2B is enabled by a first test mode signal MODE_T1 that is activated for attempting an access such as for reading the redundancy memory cell RMC corresponding to an unprogrammed fuse signal FA.

Figure 10A:
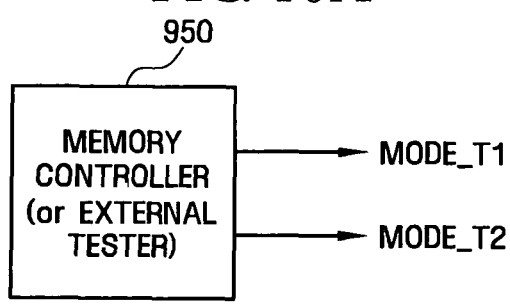
FIGS. 10A and 10B show components that generate operating mode control signals, according to an embodiment of the present invention.

Referring to FIG. 10A, the first test mode signal MODE_T1 may be provided by a memory controller 950 of the semiconductor memory device 10. Alternatively referring to FIG. 10B, the first test mode signal MODE_T1 may be provided by a mode setting register 350 (also shown in FIG. 8) of the semiconductor memory device 10 under control by the memory controller 950.

The unprogrammed fuse signal FA is generated from the address fuse unit 720 when a plurality of address fuses in the address fuse unit 720 are not programmed. If the first redundancy memory cell control unit 700 is enabled by the activated first test mode signal MODE_T1, the second redundancy memory cell control unit 900 is disabled by a second test mode signal MODE_T2 that is deactivated.

The third path of FIG. 2C is used to access the redundancy memory cell RMC corresponding to a row address signal RA during the test mode of operation regardless of functionality of the master fuse unit 500 and the address fuse unit 720. The third path of FIG. 2C is enabled when the second test mode signal MODE_T2 is activated. Instead of the row address signal RA, a signal obtained after the row address signal RA is decoded may be input to the second redundancy memory cell control unit 900 according to the number of redundancy wordlines RWLs. For example, if a redundancy wordline RWL corresponds to a respective memory block of the normal memory cell array 100, the second redundancy memory cell control unit 900 receives a block selection signal instead of the row address signal RA.

Referring to FIG. 10A, the second test mode signal MODE_T2 may be provided by the memory controller 950 of the semiconductor memory device 10. Alternatively referring to FIG. 10B, the second test mode signal MODE_T2 may be provided by the mode setting register 350 of the semiconductor memory device 10 under control by the memory controller 950.

When the second redundancy memory cell control unit 900 is enabled by the activated second test mode signal MODE_T2, the first redundancy memory cell control unit 700 is disabled by the first test mode signal MODE_T1 that is deactivated. When the second redundancy memory cell control unit 900 is enabled, data is written to the redundancy memory cell RMC through the third path of FIG. 2C.

After the test operation is performed using the second and third paths, the first path of FIG. 2A is used to access the redundancy memory cell RMC during the normal operating mode. For example, if the redundancy memory cell RMC and the redundancy memory cell access circuit 400 have been deemed to be operative during the test mode of operation, the first path of FIG. 2A is used to access the redundancy memory cell RMC for replacing the defective memory cell NMC in the normal memory cell array 100. During such normal operating mode, if the master fuse unit 500 and the address fuse unit 720 are programmed, the access circuit 800 accesses the redundancy wordline RWL when the programmed fuse signal FA matches the row address signal RA of the defective memory cell NMC.

Figure 3:
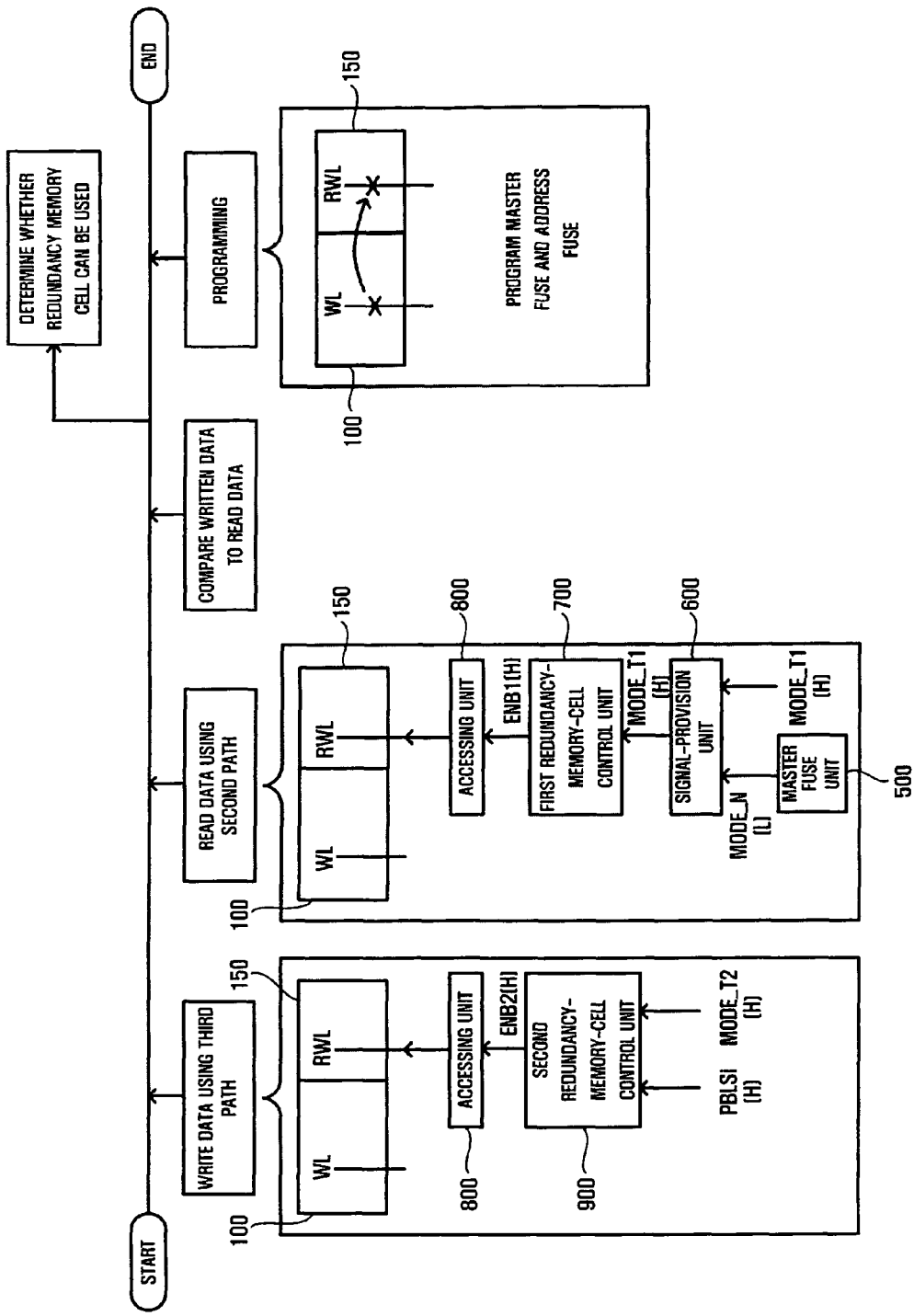
FIG. 3 shows a flow-chart of steps during operation of the semiconductor memory device of FIG. 1, according to an embodiment of the present invention.
Figure 4:
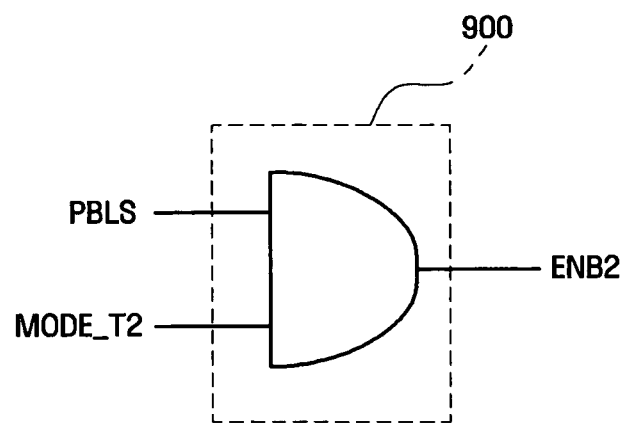
FIG. 4 is a circuit diagram of a second redundancy memory cell control unit of FIG. 1, according to an embodiment of the present invention.
Figure 5:
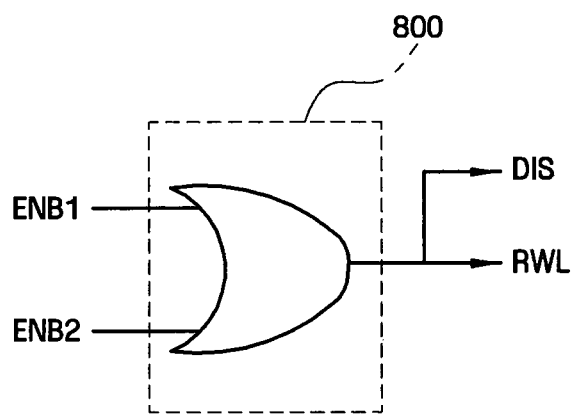
FIG. 5 is a circuit diagram of an accessing unit of FIG. 1, according to an embodiment of the present invention.
Figure 6:
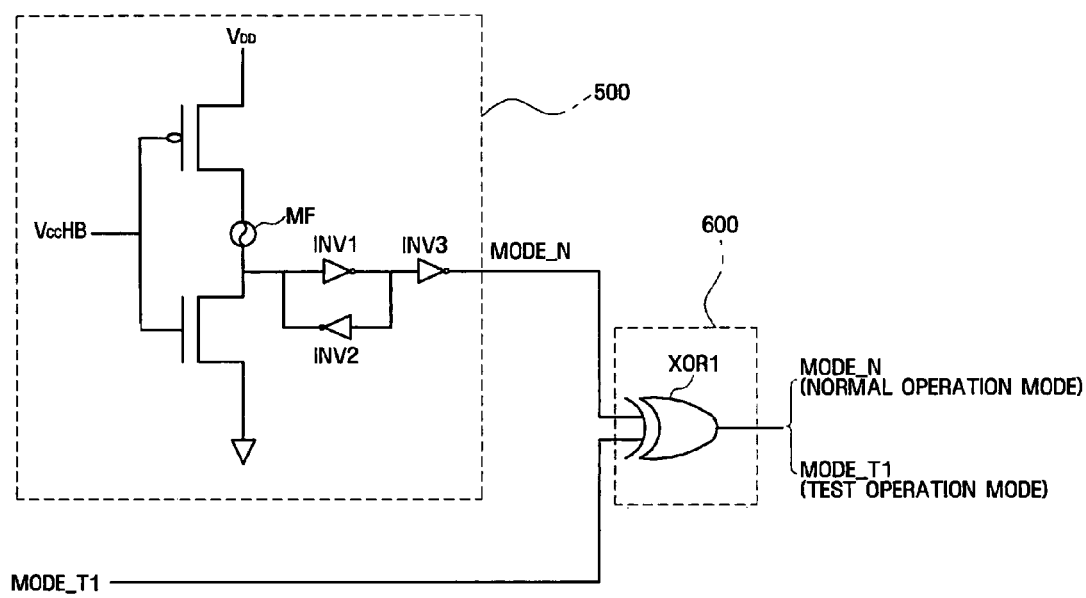
FIG. 6 is a circuit diagram of a master fuse unit and a signal provision unit of FIG. 1, according to an embodiment of the present invention.
Figure 7:
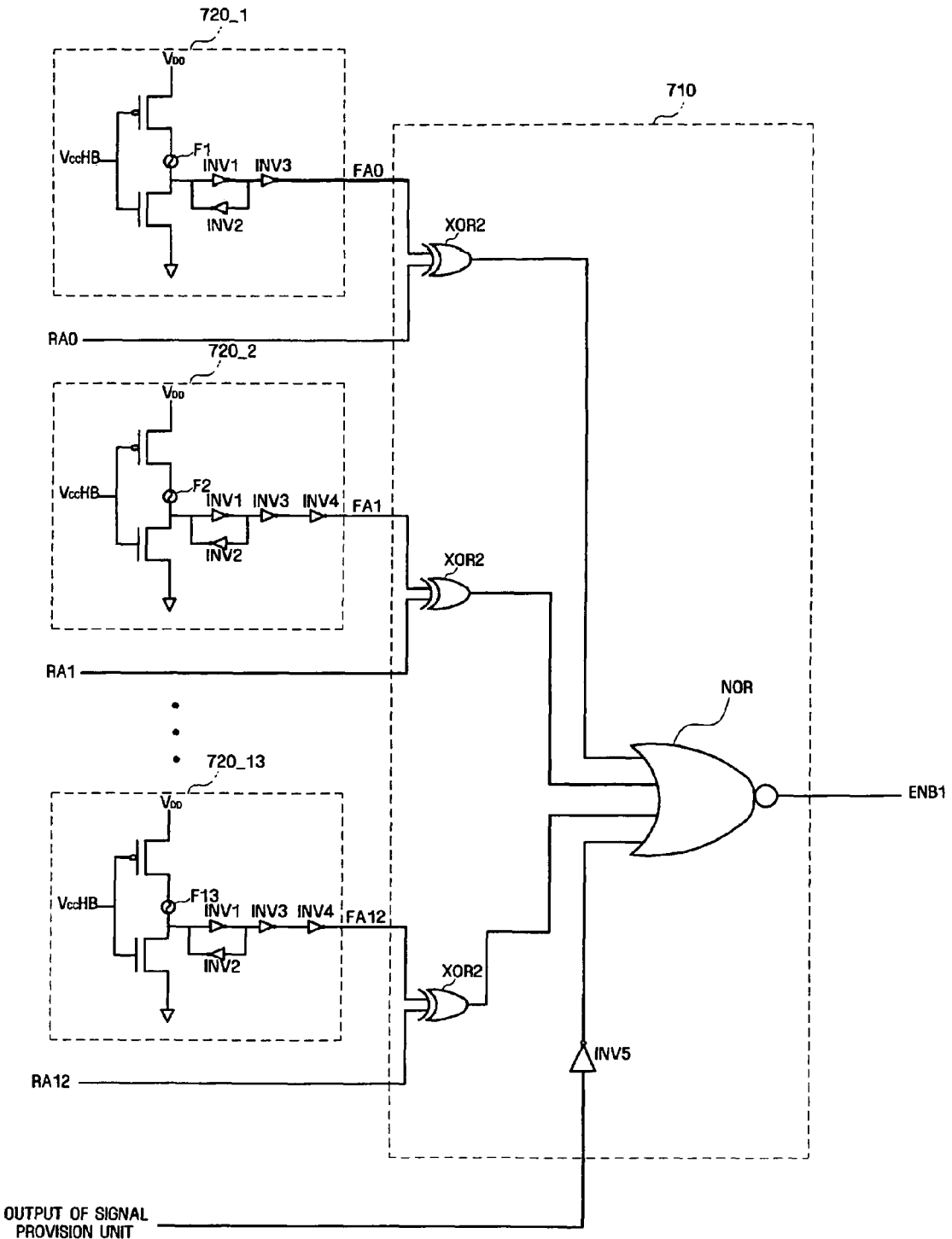
FIG. 7 is a circuit diagram of an address fuse unit and a comparison unit in a first redundancy memory cell control unit of FIG. 1, according to an embodiment of the present invention.

FIG. 3 shows a flow-chart of steps during operation of the semiconductor memory device of FIG. 1, according to an embodiment of the present invention. FIG. 4 is a circuit diagram of the second redundancy memory cell control unit 900, according to an embodiment of the present invention. FIG. 5 is a circuit diagram of the accessing unit 800, according to an embodiment of the present invention. FIG. 6 is a circuit diagram of the master fuse unit 500 and the signal provision unit 600, according to an embodiment of the present invention. FIG. 7 is a circuit diagram of the address fuse unit 720 and the comparison unit 710, according to an embodiment of the present invention.

For clarity of explanation, each redundancy wordline RWL is assumed to correspond to a respective memory block of the normal memory cell array 100. In that case, the second redundancy memory cell control unit 900 receives the block selection signal PBLS corresponding to the respective memory block of the normal memory cell array 100 instead of the row address signal RA.

Figure 9:
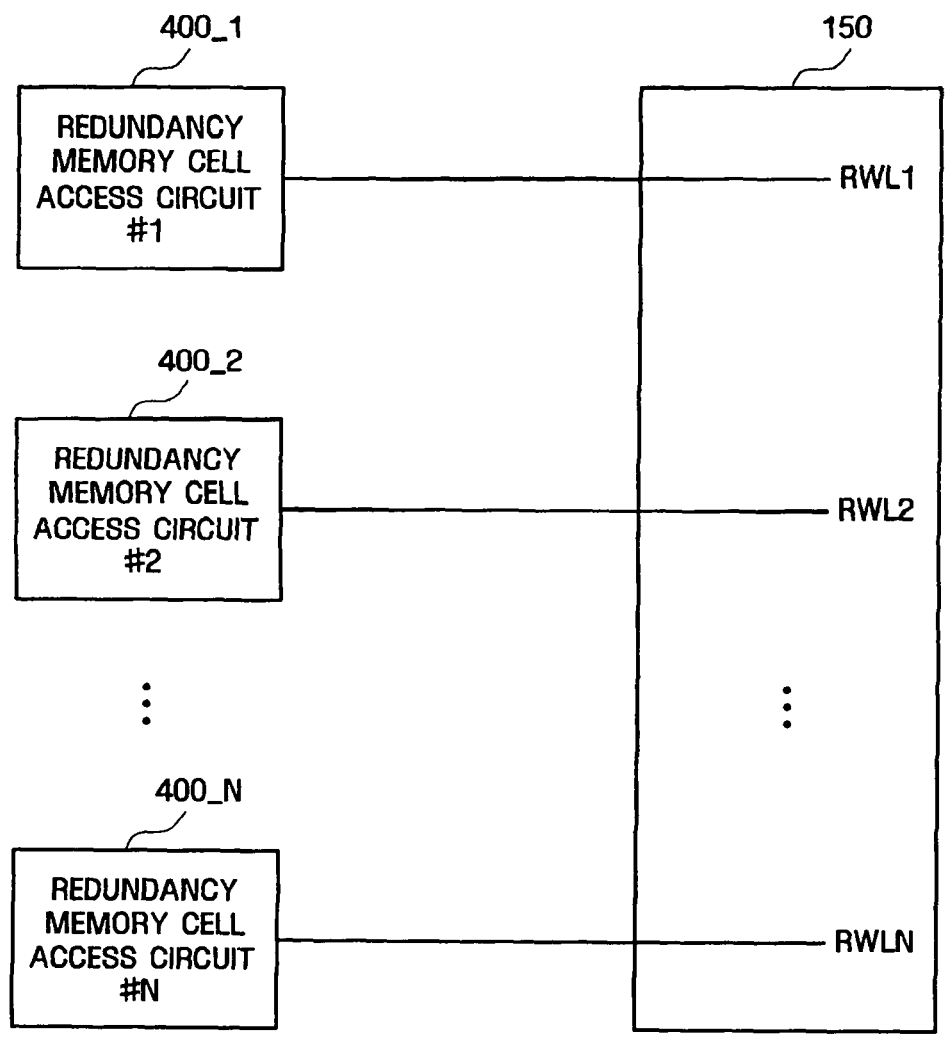
FIG. 9 is a block diagram of the semiconductor memory device of FIGS. 1 or 8 with multiple redundancy memory cell access circuits for multiple redundancy word lines in the semiconductor memory device, according to another embodiment of the present invention.

For example referring to FIG. 9, each of N redundancy wordlines RWL1, RWL2, . . . , and RWLN is for replacing a defective memory cell in a respective one of N memory blocks of the normal memory cell array 100. Further referring to FIG. 9, a respective redundancy memory cell access circuit implemented similarly to the redundancy memory cell access circuit 400 of FIG. 1 is formed for each of the redundancy wordlines RWL1, RWL2, . . . , and RWLN. Thus in FIG. 9, the N redundancy memory cell access circuits 400-1, 400-2, . . . , and 400-N are formed for the N redundancy wordlines RWL1, RWL2, . . . , and RWLN, respectively.

Referring to FIG. 3, the redundancy memory cell RMC is first accessed using the third path of FIG. 2C for writing test data therein for the test mode of operation. Such test data may be patterned data for the test operation. Referring to FIG. 4, the second redundancy memory cell control unit 900 includes an AND-gate having the block selection signal PBLS and the second test mode signal MODE_T2 as inputs. For example when the block selection signal PBLS and the second test mode signal MODE_T2 are at the logic high level, the second redundancy memory cell control unit 900 generates a second redundancy enable signal ENB2 at the logic high level to the accessing unit 800.

In the case that the redundancy wordline RWL corresponds to a respective memory block of the normal memory cell array 100, the 1-bit block selection signal PBLS corresponding to such a memory block is provided to the second redundancy memory cell control unit 900 instead of the row address signal RA. If two or more redundancy wordlines RWLs correspond to a respective memory block of the normal memory cell array 100, a multi-bit signal obtained after the row address signal RA is decoded may be provided for selecting each of the redundancy wordlines RWLs.

Referring to FIG. 5, the accessing unit 800 includes an OR-gate having the second redundancy enable signal ENB2 and a first redundancy enable signal ENB1 as inputs. When the second redundancy enable signal ENB2 from the second redundancy memory cell control unit 900 is activated to the logic high level, the accessing unit 800 allows access to the redundancy memory cell RMC by activating the redundancy wordline RWL. In that case, the accessing unit 800 activates a disable signal DIS to the row decoder 300 to disable the row decoder 300 such that the corresponding normal memory cell NMC is not accessed.

Referring back to FIG. 3, when the second redundancy enable signal ENB2 is activated by the third path of FIG. 2C, data is written to the redundancy memory cell RMC. Further referring to FIG. 3, the redundancy memory cell RMC is accessed using the second path of FIG. 2B for reading data from the redundancy memory cell RMC with the master fuse unit 500 and the address fuse unit 720 not being programmed.

Specifically referring to FIG. 6, the master fuse unit 500 includes a master fuse MF and first, second, and third inverters INV1, INV2, and INV3, respectively. In an example embodiment of the present invention, the master fuse MF is an antifuse that generally is a resistive fuse device. When unprogrammed, the antifuse has a high resistance, and after being programmed, the antifuse has a low resistance.

Such an antifuse may be formed of a very thin dielectric material such as a complex having a dielectric interposed between two conductors. The dielectric may be SiO2, silicon nitride, tantalum oxide, or a stack of silicon dioxide, silicon nitride, and silicon dioxide (i.e., ONO). In order to program the antifuse, a high voltage is applied to the antifuse through terminals of the antifuse for a sufficient amount of time for eliminating the dielectric interposed between the two conductors.

That is, the master fuse MF has a high resistance before being programmed during the test mode of operation. When receiving a redundancy initialization signal VCCHB, which transits to the logic high level from the logic low level to then return to the logic low level, the master fuse unit 500 generates a normal mode signal MODE_N at the logic low level during the test operation. If the master fuse MF is inoperative during the test mode of operation, the master fuse MF has a low resistance even before being programmed. In that case, the master fuse unit 500 generates the normal mode signal MODE_N at the logic high level during the test operation.

Further referring to FIG. 6, the signal provision unit 600 is implemented with an exclusive OR-gate XOR1. The signal provision unit 600 outputs the first test mode signal MODE_T1 during the test operation and outputs the normal mode signal MODE_N during the normal operation. For example, the signal provision unit 600 receives the normal mode signal MODE_N at the logic low level and the first test mode signal MODE_T1 at the logic high level and provides the first test mode signal MODE_T1 at the logic high level during the test operation. However, if the master fuse MF is inoperative, the master fuse unit 500 generates the normal mode signal MODE_N at the logic high level during the test operation such that the signal provision unit 600 outputs the logic low level.

Referring to FIG. 7, the address fuse unit 720 is not programmed during the test operation to generate the unprogrammed fuse signal FA that is an address of the redundancy wordline RWL. In the example of FIG. 7, the address fuse unit 720 includes first, second, . . . , and up to thirteenth sub-address fuse units 720_1, 720_2, . . . , and 720_13, respectively, each for generating a respective bit of the unprogrammed fuse signal FA. For example, if the row address signal RA has 13-bits, the unprogrammed fuse signal FA also has 13-bits such that the address fuse unit 720 includes thirteen sub-address fuse units 720_1, 720_2, . . . , and 720_13.

Each of the thirteen sub-address fuse units 720_1, 720_2, . . . , and 720_13 is implemented similarly. For example, the first sub-address fuse unit 720_1 includes a first address fuse F1 and three inverters INV1, INV2, and INV3. Prior to being programmed, that is during the test operation, the first sub-address fuse unit 720_1 generates a least significant bit (LSB) signal FA0 of the unprogrammed fuse signal FA at the logic low level.

The second sub-address fuse unit 720_2 includes a second address fuse F2 and four inverters INV1, INV2, INV3, and INV4 to generate a corresponding bit signal FA1 at the logic high level. The thirteenth sub-address fuse unit 720_13 includes a thirteenth address fuse F13 and four inverters INV1, INV2, INV3, and INV4 to generate a most significant bit (MSB) signal FA12 at the logic high level. Whether each sub-address fuse unit includes the fourth inverter INV4 determines whether the respective bit signal is at the logic high level or the logic low level.

Further referring to FIG. 7, the comparison unit 710 compares the bit signals FA0, FA1, . . . , and FA12 of the unprogrammed fuse signal FA to bit signals RA0, RA1, . . . , and RA12, respectively, of the row address signal RA. If the respective bits of the unprogrammed fuse signal FA match the respective bits of the row address signal RA, the comparison unit 710 generates the first redundancy enable signal ENB1 at the logic high level.

Otherwise, the comparison unit 710 generates the first redundancy enable signal ENB1 at the logic low level. More specifically in FIG. 7, the comparison unit 710 includes a plurality of exclusive OR-gates XOR2, each comparing one of the bit signals FA0, FA1, . . . , and FA12 of the unprogrammed fuse signal FA with a respective one of the bit signals RA0, RA1, . . . , and RA12 of the row address signal RA. If the unprogrammed fuse signal FA matches the row address signal RA, the exclusive OR-gates XOR2 all generate the logic low level to a NOR-gate that generates the first redundancy enable signal ENB1.

In addition, the output of the signal provision unit 600 is inverted by an inverter INV5 and applied to an input of the NOR-gate in the comparison unit 710. The first test mode signal MODE_T1 that is at the logic high level during the test mode is inverted to the logic low level and input by the NOR-gate within the comparison unit 710. In that case, when the unprogrammed fuse signal FA matches the row address signal RA, the NOR-gate within the comparison unit 710 generates the first redundancy enable signal ENB1 at the logic high level.

If the comparison unit 710 generates the first redundancy enable signal ENB1 at the logic high level, the accessing unit 800 of FIG. 5 allows access to the redundancy memory cell RMC by activating the redundancy wordline RWL and activates the disable signal DIS to disable the row decoder 300 such that the normal memory cell NMC is not accessed. Accordingly, the data that has been written to the redundancy memory cell RMC is read.

Then, the memory controller 950 compares such read data from the redundancy memory cell RMC to a desired data. If such read data is same as the desired data, the memory controller 950 determines that the redundancy memory cell RMC and the redundancy memory cell access circuit 400 are operative. If such read data is not same as the desired data, the main controller 950 determines that at least one of the master fuse MF, the address fuse unit 720 and the redundancy memory cell RMC is inoperative.

If the master fuse MF is inoperative, the master fuse unit 500 generates the normal mode signal MODE_N at the logic high level during the test operation even before the master fuse MF is programmed. Accordingly, the signal provision unit 600 receives the normal mode signal MODE_N at the logic high level and the first test mode signal MODE_T1 at the logic high level to generate an output at the logic low level.

In that case, the comparison unit 710 of FIG. 7 generates the first redundancy enable signal ENB1 at the logic low level even if the row address signal RA matches the unprogrammed fuse signal FA. Thus, the accessing unit 800 does not allow access to the redundancy memory cell RMC and does not disable the row decoder 300 since the first redundancy enable signal ENB1 is at the logic low level such that the normal memory cell NMC is accessed.

That is, if the master fuse unit 500 is inoperative, the corresponding redundancy memory cell RMC is not used. Instead, the corresponding normal memory cell NMC is accessed instead in that case. Thus, the corresponding normal memory cell NMC is desired to be written with data that is different from the desired data to indicate that the master fuse unit 500 is inoperative.

Also if the read data does not match the desired data, the address fuse unit 720 may have failed. For example, assume that an address of the redundancy wordline RWL with 13 bits is 1000000000010. In that case, the address fuse unit 720 is manufactured such that the unprogrammed fuse signal FA ideally matches such an address of the redundancy wordline RWL. However, the unprogrammed fuse signal FA may be 1000000000011 because of a defect in one of the fuses F1, F2, . . . , and F13 of the address fuse unit 720.

In that case, the row address signal RA that is 1000000000010 does not match the unprogrammed fuse signal FA such that the comparison unit 710 generates the first redundancy enable signal ENB1 at the logic low level. Thus, the accessing unit 800 does not activate the redundancy wordline RWL, and does not disable the row decoder 300. Consequently, the redundancy memory cell RMC is not accessed, and the normal memory cell NMC corresponding to the row address signal RA of 1000000000010 is accessed instead. That is, if the address fuse unit 720 is inoperative, the redundancy memory cell RMC is not used since it cannot be accessed.

Also if the read data does not match the desired data, the redundancy memory cell RMC may have failed. If the master fuse MF and the address fuse unit 720 are operative, the redundancy memory cell RMC is accessed. However, if the redundancy memory cell RMC has failed, the data read from the redundancy memory cell RMC is different from the desired data.

In summary, if the data read from the redundancy memory cell RMC or the corresponding memory cell NMC is different from the desired data, at least one of the master fuse unit 500, the address fuse unit 720, and the redundancy memory cell RMC is inoperative. In any case, the redundancy memory cell RMC cannot be used in that case.

If the data read from the redundancy memory cell RMC matches the desired data, the redundancy memory cell RMC and the redundancy memory cell access circuit 400 including the master fuse MF and the address fuse unit 720 are deemed to be operative. In that case, the redundancy memory cell RMC is allowed to be used for replacing a defective memory cell of the normal memory cell array 100. That is, the address fuse unit 720 is programmed to an address of the defective memory cell of the normal memory cell array 100. Also in that case, the master fuse unit 500 is programmed to indicate that the redundancy memory cell RMC is being used to replace the defective memory cell of the normal memory cell array 100.

In this manner, the master fuse unit 500 and the address fuse unit 720 are tested for functionality simultaneously with testing of the corresponding redundancy memory cell RMC for minimized testing time. In addition, the master fuse unit 500 and the address fuse unit 720 are programmed only when such testing indicates that the master fuse unit 500 and the address fuse unit 720 are operative for minimized programming time.

The normal operation of the semiconductor memory device 10 after the master fuse unit 500 and the address fuse unit 720 are programmed is now described with reference to FIGS. 1 and 2A. Since the master fuse unit 500 and the address fuse unit 720 are programmed, the master fuse unit 500 generates the normal mode signal MODE_N at the logic high level. In addition in that case, the address fuse unit 720 generates a programmed fuse signal FA during the normal operation. The programmed fuse signal FA is same as the address of the defective memory cell in the normal memory cell array 100.

The signal provision unit 600 provides the normal mode signal MODE_N at the logic high level to the comparison unit 710. In that case, the comparison unit 710 generates the first redundancy enable signal ENB1 at the logic high level only when the row address signal RA is same as the programmed fuse signal FA. When the first redundancy enable signal ENB1 is at the logic high level, the accessing unit 800 disables the row decoder 300 and allows access to the redundancy memory cell RMC by activating the redundancy wordline RWL. Accordingly, the corresponding defective memory cell in the normal memory cell array 100 is replaced by the redundancy memory cell RMC.

Figure 8:
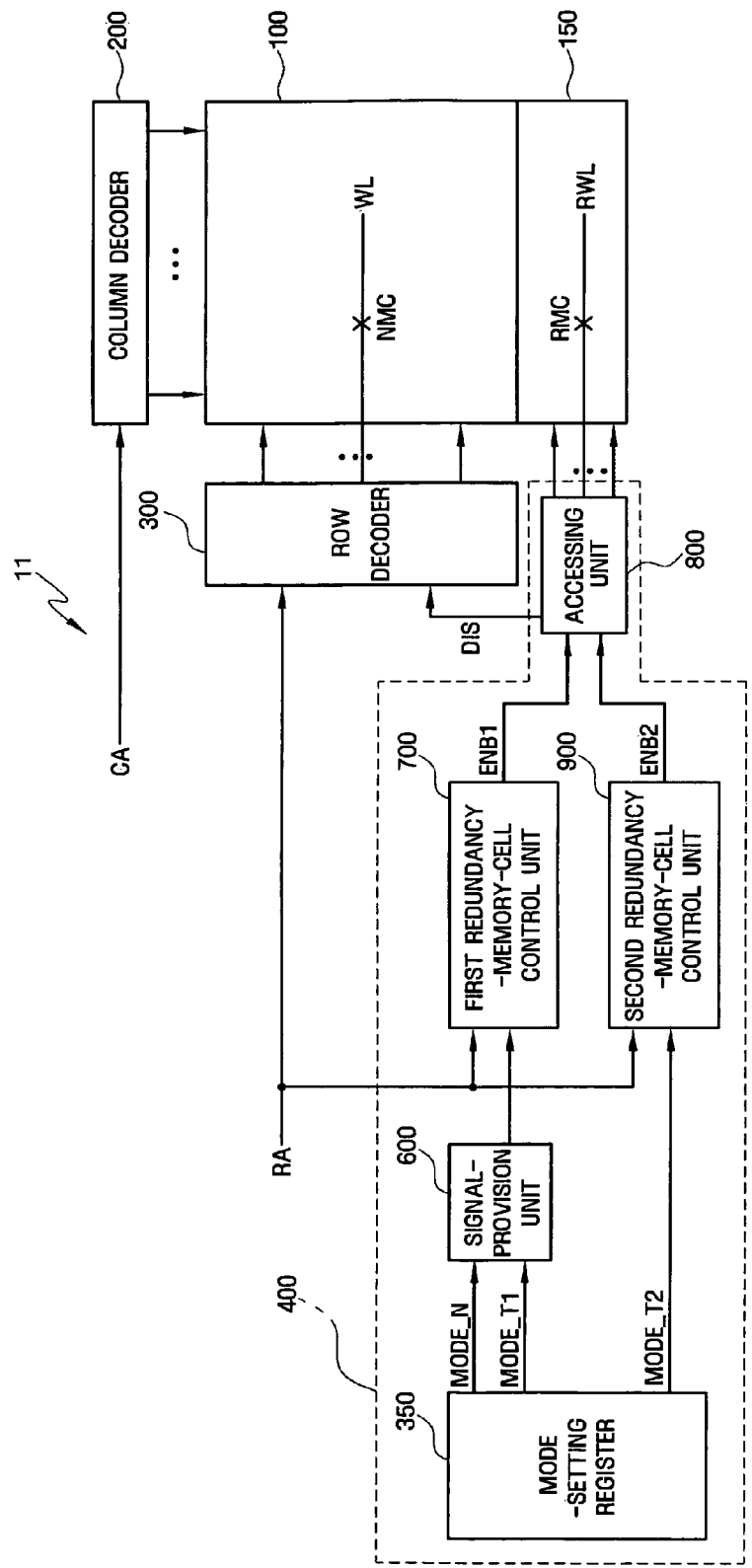
FIG. 8 is a block diagram of a semiconductor memory device with a redundancy memory cell access circuit that is tested during testing of a redundancy memory cell, according to another embodiment of the present invention.

FIG. 8 is a block diagram of a semiconductor memory device 11 with a redundancy memory cell access circuit 401 that is tested during testing of the redundancy memory cell RMC, according to another embodiment of the present invention. Elements having the same reference number in FIGS. 1 and 8 refer to elements having similar structure and/or function, and repeated descriptions of such similar elements are omitted.

However in FIG. 8, the redundancy memory cell access circuit 401 does not include the master fuse unit 500 of FIG. 1. Rather in FIG. 8, the normal mode signal MODE_N is provided by the mode setting register 350. In addition in FIG. 8 during the test mode of operation, the mode setting register 350 provides the normal mode signal MODE_N at the logic low level, the first test mode signal MODE_T1 at the logic low level, and the second test mode signal MODE_T2 at the logic high level. When the second test mode signal MODE_T2 is at the logic high level, data is written to the redundancy memory cell RMC via the second redundancy memory cell control unit 900 and the accessing unit 800.

Subsequently, the mode setting register 350 provides the normal mode signal MODE_N at the logic low level, the first test mode signal MODE_T1 at the logic high level, and the second test mode signal MODE_T2 at the logic low level. Since the first test mode signal MODE_T1 is at the logic high level, data is read from the redundancy memory cell RMC via the signal provision unit 600, the first redundancy memory cell control unit 700, and the accessing unit 800.

If the redundancy memory cell RMC and the address fuse unit 720 in the first redundancy memory cell control unit 700 are deemed to be operative, and a defective memory cell is found, the address fuse unit 720 is programmed to an address of the defective memory cell. For replacing the defective memory cell in the normal memory cell array 100 with the redundancy memory cell RMC during the normal operating mode, the mode setting register 350 generates the normal mode signal MODE_N at the logic high level, the first test mode signal MODE_T1 at the logic low level, and the second test mode signal MODE_T2 at the logic low level. If no defective memory cell is found in the normal memory cell array 100, the mode setting register 350 generates the normal mode signal MODE_N at the logic low level, the first test mode signal MODE_T1 at the logic low level, and the second test mode signal MODE_T2 at the logic low level.

In another alternative embodiment of the present invention, the signal provision unit 600 may be omitted. In that case, the mode setting register 350 would directly provide the first test mode signal MODE_T1 and the normal mode signal MODE_N to the first redundancy memory cell control unit 700 and directly provide the second test mode signal MODE_T2 to the second redundancy memory cell control unit 900.

Figure 10B:
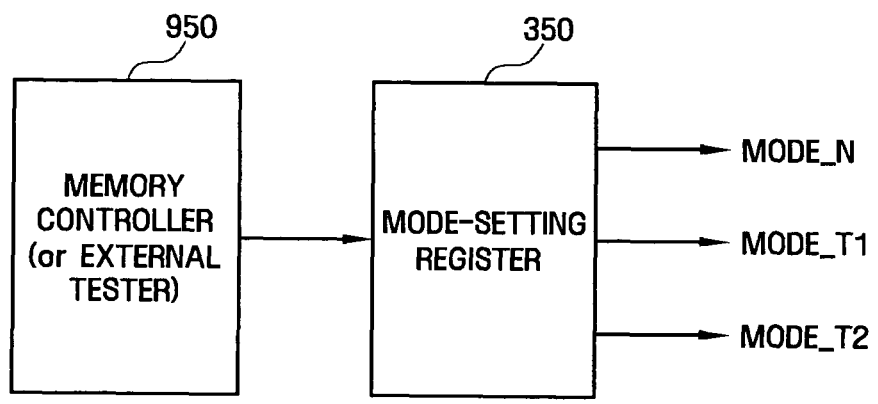

In a further alternative embodiment of the present invention referring to FIGS. 10A and 10B, an external tester may provide at least one of the normal mode signal MODE_N, the first test mode signal MODE_T1, and the second test mode signal MODE_T2. In that case, such signals would be applied from the external tester to the semiconductor memory device 10 or 11 via pins of the integrated circuit package containing the semiconductor memory device 10 or 11.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

The present invention is limited only as defined in the following claims and equivalents thereof.

What is claimed is:

1. A redundancy memory cell access circuit comprising:
a first control unit that compares an unprogrammed fuse signal with an address signal to generate a first redundancy enable signal from the comparison during a test operation;
at least one fuse unit that generates the unprogrammed fuse signal that represents an address of a redundancy memory cell during the test operation,
and wherein the at least one fuse unit generates a programmed fuse signal that represents an address of a defective memory cell during a normal operation, and wherein the unprogrammed fuse signal is different from the programmed fuse signal; and
an accessing unit that allows access to said redundancy memory cell corresponding to the address signal when the first redundancy enable signal is activated from the unprogrammed fuse signal being equal to the address signal for testing of the redundancy memory cell without the redundancy memory cell being used to replace any defective memory cell during the test operation,
wherein said accessing unit substitutes said defective memory cell with said redundancy memory cell when said programmed fuse signal is equal to the address signal during the normal operation.

2. The redundancy memory cell access circuit of claim 1, wherein the first control unit activates the first redundancy enable signal if the unprogrammed fuse signal is substantially same as a desired address signal when a first test mode signal is activated during the test operation.

3. The redundancy memory cell access circuit of claim 2, wherein the first control unit includes:
a plurality of address fuses that are not programmed for generating said unprogrammed fuse signal during the test operation; and
a comparison unit that compares the unprogrammed fuse signal with the address signal to generate the first redundancy enable signal from the comparison.

4. The redundancy memory cell access circuit of claim 2, further comprising:
a second control unit for activating a second redundancy enable signal when a second test mode signal is activated during the test operation;
wherein the accessing unit provides access to the redundancy memory cell when the second redundancy enable signal is activated for writing into the redundancy memory cell without regard to functionality of any fuse unit before the redundancy memory cell is accessed via the first control unit.

5. The redundancy memory cell access circuit of claim 4, wherein the first control unit is disabled to generate the first enable signal that is inactivated when the first test mode signal is inactivated;
and wherein the second control unit is disabled to generate the second enable signal that is inactivated when the second test mode signal is inactivated;
and wherein the second test mode signal is first activated while the first test mode signal is inactivated, and wherein the first test mode signal is subsequently activated while the second test mode signal is inactivated, during the test operation.

6. The redundancy memory cell access circuit of claim 1, further comprising:
a signal provision unit that generates a normal mode signal that is activated when a master fuse unit is inoperative during the test operation,
wherein the first control unit inactivates the first redundancy enable signal such that the accessing unit prevents access to the redundancy memory cell when the master fuse unit is inoperative.

7. The redundancy memory cell access circuit of claim 6, wherein a normal memory cell corresponding to the address signal is accessed for indicating that at least one of the address fuse unit and the master fuse unit is inoperative when the first redundancy enable signal is inactivated during the test operation.

8. The redundancy memory cell access circuit of claim 7, wherein bit data is read from the redundancy memory cell when the first redundancy enable signal is activated, and wherein the read bit data is compared with a desired bit data to determine whether the redundancy memory cell is operative during the test operation.

9. The redundancy memory cell access circuit of claim 8, wherein the signal provision unit activates the normal mode signal transmitted to the first control unit that provides access to the redundancy memory cell when said programmed fuse signal is same as the address signal during the normal operation if the address fuse unit, the master fuse unit, and the redundancy memory cell have been determined to be operative as indicated by the master fuse unit that is programmed.

10. The redundancy memory cell access circuit of claim 1, further comprising:
a mode setting register for generating a normal mode signal and a first test mode signal for indicating which of the normal operation and the test operation is to be performed.

11. A semiconductor memory device comprising:
a normal memory cell array;
a redundancy memory cell array having a redundancy memory cell for replacing a defective memory cell in the normal memory cell array; and
a redundancy memory cell access circuit including:
a first control unit that compares an unprogrammed fuse signal with an address signal to generate a first redundancy enable signal from the comparison during a test operation;
at least one fuse unit that generates the unprogrammed fuse signal that represents an address of a redundancy memory cell during the test operation,
and wherein the at least one fuse unit generates a programmed fuse signal that represents an address of a defective memory cell during a normal operation, and wherein the unprogrammed fuse signal is different from the programmed fuse signal; and
an accessing unit that allows access to the redundancy memory cell corresponding to the address signal when the first redundancy enable signal is activated from the unprogrammed fuse signal being equal to the address signal for testing of the redundancy memory cell without the redundancy memory cell being used to replace any defective memory cell during the test operation,
wherein said accessing unit substitutes said defective memory cell with said redundancy memory cell when said programmed fuse signal is equal to the address signal during the normal operation.

12. The semiconductor memory device of claim 11, wherein the first control unit activates the first redundancy enable signal when the unprogrammed fuse signal is substantially same as a desired address signal when a first test mode signal is activated during the test operation.

13. The semiconductor memory device of claim 12, wherein the first control unit includes:
- a plurality of address fuses that are not programmed for generating said unprogrammed fuse signal during the test operation; and
- a comparison unit that compares the unprogrammed fuse signal with the address signal to generate the first redundancy enable signal from the comparison.

14. The semiconductor memory device of claim 12, wherein the redundancy memory cell access circuit further includes:
- a second control unit for activating a second redundancy enable signal when a second test mode signal is activated during the test operation;
- wherein the accessing unit provides access to the redundancy memory cell when the second redundancy enable signal is activated for writing into the redundancy memory cell without regard to operation of any fuse unit before the redundancy memory cell is accessed via the first control unit.

15. The semiconductor memory device of claim 14, wherein the first control unit is disabled to generate the first enable signal that is inactivated when the first test mode signal is inactivated;
- and wherein the second control unit is disabled to generate the second enable signal that is inactivated when the second test mode signal is inactivated;
- and wherein the second test mode signal is first activated while the first test mode signal is inactivated, and wherein the first test mode signal is subsequently activated while the second test mode signal is inactivated, during the test operation.

16. The semiconductor memory device of claim 11, wherein the redundancy memory cell access circuit further includes:
- a signal provision unit that generates a normal mode signal that is activated when a master fuse unit is inoperative during the test operation,
- wherein the first control unit inactivates the first redundancy enable signal such that the accessing unit prevents access to the redundancy memory cell when the master fuse unit is inoperative.

17. The semiconductor memory device of claim 16, wherein a normal memory cell corresponding to the address signal in the normal memory cell array is accessed for indicating that at least one of the address fuse unit and the master fuse unit is inoperative when the first redundancy enable signal is inactivated during the test operation.

18. The semiconductor memory device of claim 17, wherein bit data is read from the redundancy memory cell when the first redundancy enable signal is activated, and wherein the read bit data is compared with a desired bit data to determine whether the redundancy memory cell is operative during the test operation.

19. The semiconductor memory device of claim 18, wherein the signal provision unit activates the normal mode signal transmitted to the first control unit that provides access to the redundancy memory cell when said programmed fuse signal is same as the address signal during the normal operation if the address fuse unit, the master fuse unit, and the redundancy memory cell have been determined to be operative as indicated by the master fuse unit that is programmed.

20. The semiconductor memory device of claim 11, further comprising:
- a mode setting register for generating a normal mode signal and a first test mode signal for indicating which of the normal operation and the test operation is to be performed.

* * * * *